US009755092B2

United States Patent
Heo et al.

(10) Patent No.: US 9,755,092 B2
(45) Date of Patent: Sep. 5, 2017

(54) OPTICAL DEVICE INCLUDING TWO-DIMENSIONAL MATERIAL AND METHOD OF MANUFACTURING THE SAME

(71) Applicant: Samsung Electronics Co., Ltd., Suwon-si, Gyeonggi-do (KR)

(72) Inventors: Jinseong Heo, Seoul (KR); Kiyoung Lee, Seoul (KR); Jaeho Lee, Seoul (KR); Sangyeob Lee, Hwaseong-si (KR); Eunkyu Lee, Yongin-si (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/932,701

(22) Filed: Nov. 4, 2015

(65) Prior Publication Data

US 2016/0359062 A1    Dec. 8, 2016

(30) Foreign Application Priority Data

Jun. 2, 2015  (KR) .................. 10-2015-0078239

(51) Int. Cl.
*H01L 31/02* (2006.01)
*H01L 31/18* (2006.01)
(Continued)

(52) U.S. Cl.
CPC ...... *H01L 31/0352* (2013.01); *H01L 31/0264* (2013.01); *H01L 31/035218* (2013.01); *H01L 31/18* (2013.01)

(58) Field of Classification Search
CPC ... H01L 31/02; H01L 31/028; H01L 31/0322; H01L 31/03; H01L 31/18; H01L 31/0264; H01L 31/0352; H01L 31/035218
See application file for complete search history.

(56) References Cited

U.S. PATENT DOCUMENTS 8,507,890 B1    8/2013  Koppens et al.
8,519,258 B2    8/2013  Forrest et al.
(Continued)

FOREIGN PATENT DOCUMENTS

JP    2014-170953 A    9/2014
KR   10-2009-0046015 A   5/2009

OTHER PUBLICATIONS

Xiao et al., "Toward high-speed, low-cost, on-chip silicon optical interconnects", SPIE, pp. 1-4, (2010).
(Continued)

*Primary Examiner* — Fazli Erdem
(74) *Attorney, Agent, or Firm* — Harness, Dickey & Pierce P.L.C.

(57) ABSTRACT

An optical device including a two-dimensional material and a method of manufacturing the same are provided. The optical device may include a barrier stack formed on a bottom channel layer, a top channel layer formed on the barrier stack, a drain electrode connected to the bottom channel layer, a source electrode formed on a substrate. The barrier stack may include two or more barrier layers, and one or more channel units at least partially interposing between the barrier layers. Channel units connected to the drain electrode and channel units connected to the source electrode may be formed, in an alternating sequence, between barrier layers included in the barrier stack. The barrier layers may each have a thickness which is less than a distance which may be traveled by electrons and holes generated by photo absorption prior to recombination. As a result, the optical device may provide improved photo separation efficiency.

22 Claims, 13 Drawing Sheets

(51) Int. Cl.
*H01L 31/0352* (2006.01)
*H01L 31/0264* (2006.01)

(56) References Cited

U.S. PATENT DOCUMENTS

| | | | |
|---|---|---|---|
| 8,941,203 B2 | 1/2015 | Wehner et al. | |
| 9,105,556 B2 | 8/2015 | Heo et al. | |
| 2010/0270589 A1 | 10/2010 | Suh et al. | |
| 2012/0248414 A1* | 10/2012 | Kim | B82Y 10/00 257/29 |
| 2013/0049738 A1* | 2/2013 | Sargent | H01L 31/035218 324/96 |
| 2013/0285018 A1* | 10/2013 | Yoo | H01L 31/0232 257/29 |
| 2013/0313524 A1* | 11/2013 | De Micheli | H01L 29/775 257/29 |
| 2014/0014905 A1* | 1/2014 | Lee | H01L 29/78 257/29 |
| 2014/0097403 A1* | 4/2014 | Heo | H01L 29/7391 257/27 |
| 2014/0231752 A1* | 8/2014 | Shin | H01L 29/1606 257/29 |
| 2014/0264275 A1* | 9/2014 | Zhong | H01L 31/028 257/21 |
| 2015/0122315 A1* | 5/2015 | Shin | H01L 29/73 136/255 |
| 2015/0171167 A1* | 6/2015 | Nourbakhsh | H01L 29/1606 257/29 |
| 2015/0357504 A1* | 12/2015 | Chen | H01L 31/028 257/27 |
| 2015/0364545 A1* | 12/2015 | Heo | H01L 29/1033 257/24 |
| 2016/0020280 A1* | 1/2016 | Heo | H01L 29/78684 257/27 |
| 2016/0056301 A1* | 2/2016 | Lee | H01L 29/792 365/185.29 |
| 2016/0141373 A1* | 5/2016 | Cantoro | H01L 29/267 257/27 |
| 2016/0204204 A1* | 7/2016 | Franklin | H01L 29/778 257/29 |
| 2017/0018638 A1* | 1/2017 | Teo | H01L 29/7784 |

OTHER PUBLICATIONS

Britnell et al., "Strong Light-Matter Interactions in Heterostructures of Atomically Thin Films", Science Express, pp. 1-12, (May 2013).
Mueller et al., "Graphene photodetectors for high-speed optical communications", Nature Photonics, vol. 4, pp. 297-301, (May 2010).

* cited by examiner

FIG. 4(a)
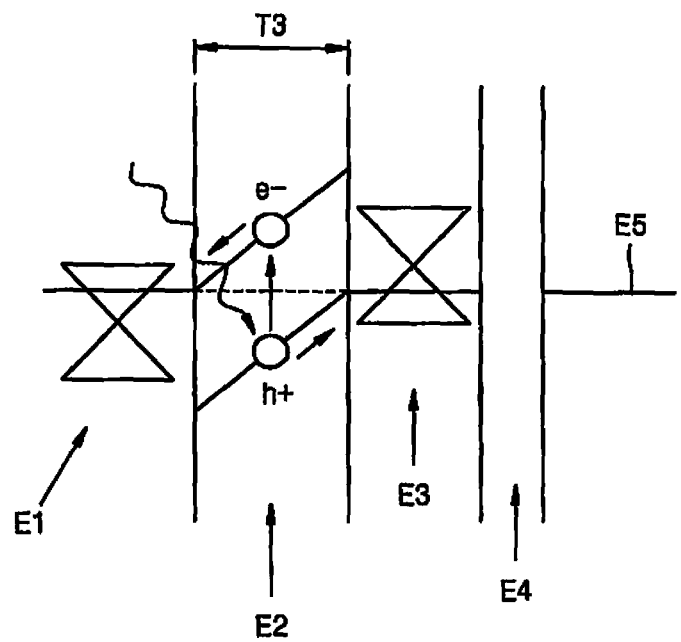
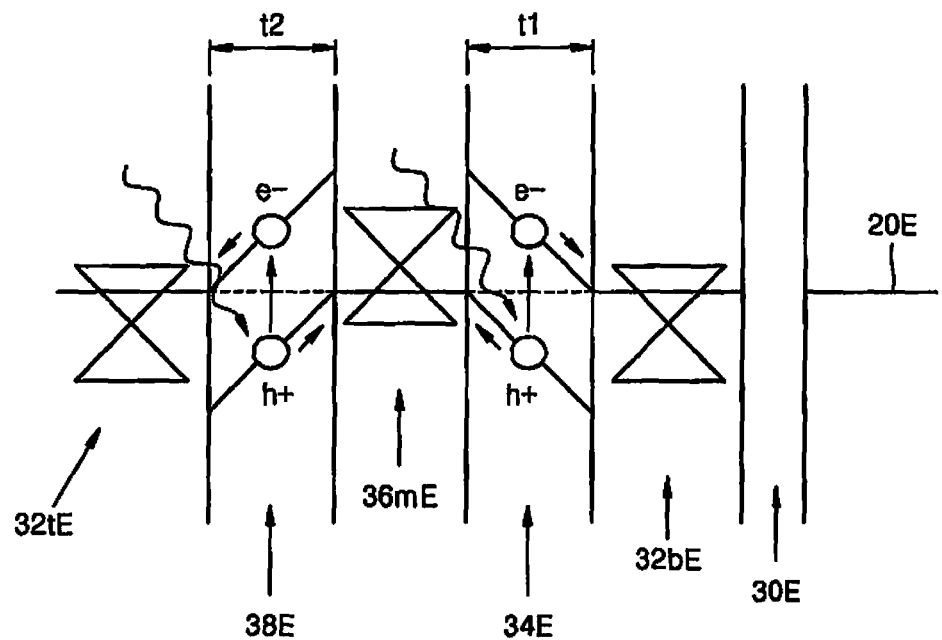
FIG. 4(b)

OPTICAL DEVICE INCLUDING TWO-DIMENSIONAL MATERIAL AND METHOD OF MANUFACTURING THE SAME

CROSS-REFERENCE TO RELATED APPLICATION

This application claims the benefit of Korean Patent Application No. 10-2015-0078239, filed on Jun. 2, 2015, in the Korean Intellectual Property Office, the disclosure of which is incorporated herein in its entirety by reference.

BACKGROUND

1. Field

Some embodiments relate to an optical device, and more particularly, an optical device configured to provide improved photo separation efficiency and a method of manufacturing the same.

2. Description of the Related Art

In some cases, an optical device includes photodetector which includes a two-dimensional (2D) material layer, including a transition metal dichalcogenide (TMD) layer. The TMD material layer may absorb light, and electrons and holes generated by the absorbed light may move out to electrodes at both sides of the TMD material layer. In some cases, a photo absorption rate associated with a photodetector varies depending on a thickness of the TMD material layer and the TMD material layer may be formed as a relatively thick layer, as light absorption of the TMD material layer may be improved with increased thickness of the TMD material layer.

However, as layer thickness increases, electrons and holes generated in the TMD material layer may, in a process of moving through the TMD material layer out to electrodes at both sides of the TMD material layer, disappear after recombination due to their falling down to a conduction band and a valence band of the TMD material layer. In some cases, the movement of the electrons and holes through the TMD material layer may be at least partially hindered due to defects existing in the TMD material layer. As a result, photo separation efficiency of the TMD material layer, and thus the optical device, may be reduced with increased thickness of the TMD material layer.

SUMMARY

Provided is an optical device including a two-dimensional (2D) material which may be configured to increase both photo absorption rate and photo separation efficiency.

Provided is a method of manufacturing the optical device.

Additional aspects will be set forth in part in the description which follows and, in part, will be apparent from the description, or may be learned by practice of at least the presented example embodiments.

According to some embodiments, the optical device may include a barrier stack formed on a bottom channel layer, a top channel layer formed on the barrier stack, a drain electrode connected to the bottom channel layer, a source electrode connected to the channel unit, wherein the barrier stack may include the barrier stack including at least two barrier layers at least partially interposed by a channel unit. The barrier stack may include a first barrier layer and a second barrier layer placed over the first barrier layer, and the channel unit, connected to the source electrode, between the first barrier layer and the second barrier layer In the optical device, the barrier stack may further include a plurality of barrier layers at least partially interposed by separate channel layers connected to either the drain electrode or to the source electrode in an alternating interposing sequence.

At least one barrier layer of the first barrier layer and the second barrier layer may be at least one of a 2D material layer or a semiconductor layer.

The bottom channel layer may include a metal layer.

The bottom channel layer and the top channel layer may be doped in a first doping type, and the channel unit may be doped in a second doping type which is opposite to the first doping type.

When a distance that electrons and holes generated by photo absorption move ("travel") until recombination is defined as a particular distance, the thickness of each barrier layer of the first barrier layer and the second barrier layer may be less than the particular distance.

The bottom channel layer and the top channel layer and the channel unit may include 2D material layers in a single layer.

The bottom channel layer and the top channel layer may extend, relative to the channel unit, at a right angle, an acute, or an obtuse angle.

The source electrode may extend in a linear shape and the optical device may further comprise a plurality of drain electrodes corresponding to the source electrode.

At least one barrier layer of the at least two barrier layers may include a semiconductor layer, and the semiconductor layer may include at least one of a IV-group semiconductor, a III-V group compound semiconductor, an oxide semiconductor, a nitride semiconductor, or an oxynitride semiconductor.

The semiconductor layer may include at least one of a 2D semiconductor layer. The 2D semiconductor layer may include a metal chalcogenide-based material layer.

The semiconductor layer may include at least one of a 2D semiconductor layer, a quantum dot-contained layer, or a quantum dot layer. The quantum dot layer may include a plurality of quantum dots, and each quantum dot may include a core unit and a shell unit surrounding the core unit.

In a method of manufacturing an optical device according to some embodiments, a first channel layer may be formed on a substrate, and a first barrier layer and a second barrier layer may be sequentially formed over the first channel layer. A second channel layer may include a channel unit extended between the first barrier layer and the second barrier layer, and a third channel layer may cover an upper side surface of the second barrier layer and be connected to the first channel layer. Forming the second barrier layer on the first barrier layer may result in the channel unit at least partially interposing between the first barrier layer and the second barrier layer. A drain electrode may be formed on the first channel layer and a source electrode is formed on the second channel layer.

Prior to forming the third channel layer, at least one barrier layer may be laminated on the second barrier layer, and channel units connected to the source electrode and channel layers connected to the drain electrode may be laminated in an alternating sequence between barrier layers comprising the second barrier layer and the at least one barrier layer.

The first channel layer and the second channel layer may be formed at a right angle to each other, at an acute angle to each other, or at an obtuse angle to each other.

The source electrode may be formed to extend in a linear shape, and the method may further comprise forming a plurality of drain electrodes which correspond to the source electrode.

The first channel layer may include a metal layer.

The first channel layer, the second channel layer, and the third channel layer may include separate two-dimensional (2D) material layers in a single layer.

The first barrier layer and the second barrier layer may each include at least one of a 2D material layer or a semiconductor layer, and the first barrier layer and the second barrier layer each comprise different photo absorption characteristics.

The first channel layer, the second channel layer, and the third channel layer may each include at least one doped layer.

A thickness of each barrier layer, of the first barrier layer and the second barrier layer may be less than a particular distance traveled by electrons and holes prior to recombination, where the electrons and holes are generated by photo absorption.

BRIEF DESCRIPTION OF THE DRAWINGS

These and/or other aspects will become apparent and more readily appreciated from the following description of some embodiments, taken in conjunction with the accompanying drawings in which:

FIGS. 4(a) and 4(b) are a cross-sectional views illustrating energy band structures of the first and second channel layers and the first and second barrier layers of the optical device illustrated in FIGS. 1 through 3 and an energy band structure of a conventional optical device for comparison with the energy band structures of the first and second channel layers and the first and second barrier layers, according to some embodiments;

Figure 1:
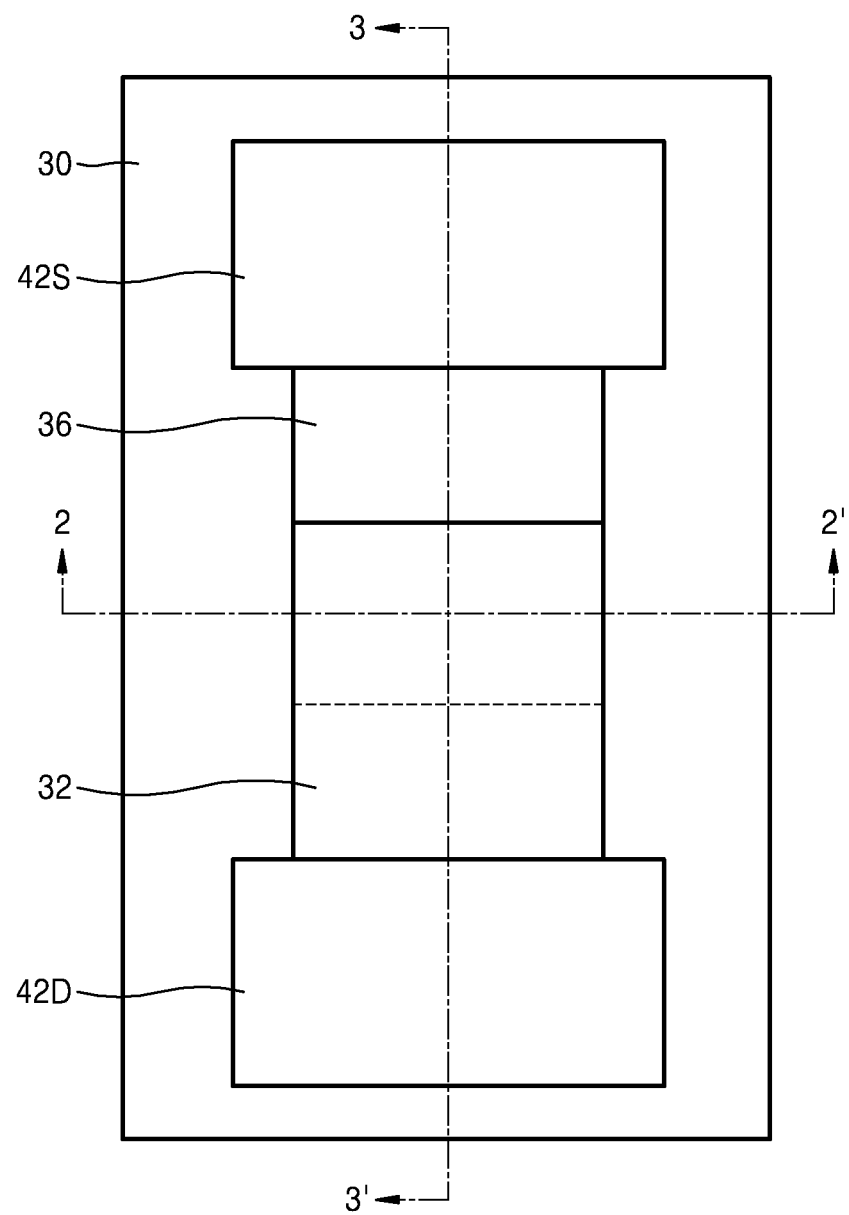
FIG. 1 is a plan view of an optical device including a 2D material, according to some embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Below, a detailed description on an optical device including a two-dimensional (2D) material and a method of manufacturing the same is provided with reference to accompanying figures. It should be understood that, in the description, the thickness of layers or regions illustrated in the figures may be exaggerated for clarity of the specification.

Firstly, an optical device including a two-dimensional (2D) material is described.

FIG. 1 is a plan view of an optical device including the 2D material, according to some embodiments. The optical device illustrated in FIG. 1 may include a photodetector.

Referring to FIG. 1, a source electrode 42S and a drain electrode 42D may be placed in a region of an insulating layer 30. The source electrode 42S and the drain electrode 42D may be spaced apart from each other. A first channel layer 32 and a second channel layer 36 may be placed between the source electrode 42S and the drain electrode 42D. The first channel layer 32 may be coupled to the drain electrode 42D. The second channel layer 36 may be coupled to the source electrode 42S. A portion of the first channel layer 32 may overlap a portion of the second channel layer 36. Portions of the first channel layer 32 and the second channel layer 36 may overlap each other. Portions of the first channel layer 32 and the second channel layer 36 may be physically isolated from contact with each other. In FIG. 1, illustrated horizontal thickness of each of the first and second channel layers 32 and 36 are illustrated as narrower than the illustrated horizontal thicknesses of the source and drain electrodes 42S and 42D; however, illustrated horizontal thickness of the first and second channel layers 32 and 36 may be the same as the illustrated horizontal thicknesses of the source and drain electrodes 42S and 42D.

The first and second channel layers 32 and 36 may be transparent to light and may include one or more layers which include a material associated with a low photo absorption rate. The first channel layer 32 may include a graphene layer. The second channel layer 36 may include a graphene layer. The first and second channel layers 32 and 36 may include graphene layers in a single layer. When the first and second channel layers 32 and 36 comprise one or more graphene layers, the optical device may include one or more doped graphene layers. The first channel layer 32 and the second channel layer 36 may include opposite doping types. For example, when one of the first channel layer 32 and the second channel layer 36 is doped p-type, the other channel layer may be doped n-type. A doped graphene layer may be intentionally doped with impurities; however, may be naturally contaminated by impurities in the process of forming graphene. The first and second channel layers 32 and 36 may include one or more layers including one or more 2D materials except graphene. In some embodiments, each of the first and second channel layers may be the 2D material layer in a single layer.

Figure 2:
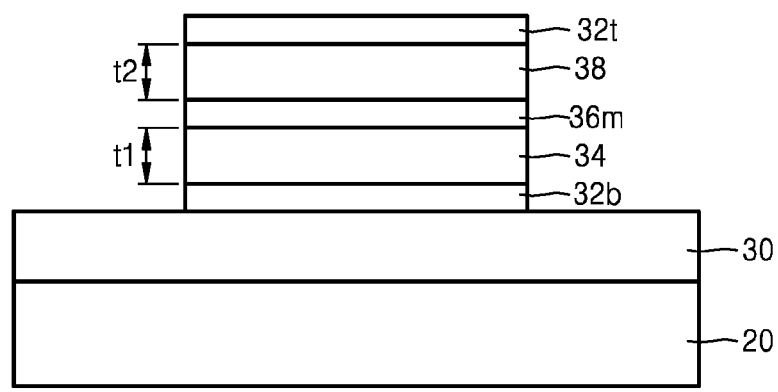
FIG. 2 is a cross-sectional view of the optical device, cut along line 2-2' in FIG. 1.

FIG. 2 is a cross-sectional view of the optical device, cut along line 2-2' in FIG. 1.

Referring to FIG. 2, the insulating layer 30 is formed on a substrate 20. The insulating layer 30 may include, for example, a silicon oxide layer. Both the substrate 20 and the insulating layer 30 may be collectively referred to as a base substrate. A bottom channel layer 32b may be placed on a partial region of the insulating layer 30. A first barrier layer 34, a horizontal channel unit 36m, a second barrier layer 38, and a top channel layer 32t may be sequentially laminated over the bottom channel layer 32b. Both the first and second barrier layers 34 and 38, which are sequentially laminated, may be collectively referred to as a barrier stack.

The term "barrier stack" may indicate a lamination where more than two barrier layers are sequentially laminated.

An energy barrier may be formed between the bottom channel layer 32b and the horizontal channel unit 36m as a result of the first barrier layer 34 being located between the bottom channel layer 32b and the horizontal channel unit 36m. Another energy barrier may be formed between the horizontal channel unit 36m and the top channel layer 32t as a result of second barrier layer 38 being located between the horizontal channel unit 36m and the top channel layer 32t.

Light incident on the optical device in FIG. 2 may be absorbed by the first and second barrier layers 34 and 38, and electrons and holes may be generated inside the first and second barrier layers 34 and 38 due to the photoelectric effect. A built-in potential may be generated between the top channel layer 32t and the horizontal channel unit 36m, as well as between the bottom channel layer 32b and the horizontal channel unit 36m, due to the first and second barrier layers 34 and 38. When the top and bottom channel layers 32t and 32b, and the horizontal channel unit 36m, comprise one or more doped graphene layers, the built-in potential may increase at an equilibrium state. As a result, electrons generated inside the first and second barrier layers 34 and 38 may move to the bottom channel layer 32b connected to the drain electrode 42D, and holes may move to the horizontal channel unit 36m connected to the source electrode 42S, thereby completing photoscission. The first barrier layer 34 may comprise a first thickness t1 which enables complete photoscission of electrons and holes. The second barrier layer 38 may comprise a second thickness t2 which enables complete photoscission of electrons and holes. When the first barrier layer 34 and the second barrier layer 38 have a particular thickness, electrons and holes generated inside the first and second barrier layers 34 and 38 may recombine with each other. In addition, when the first barrier layer 34 and the second barrier layer 38 have the particular thickness, a movement or tunneling of electrons and holes generated inside the first and second barrier layers 34 and 38 may be at least partially inhibited, obstructed, interfered, etc. by defects in the first and second barrier layers 34 and 38. Thus, when the first barrier layer 34 and the second barrier layer 38 have the particular thickness, photoscission efficiency of the first and second barrier layers 34 and 38 may decrease. In some embodiments, the first thickness t1 of the first barrier layer 34 and the second thickness t2 of the second barrier layer 38 may be equal to or less than the particular thickness. In some embodiments, where the distance that electrons and holes, which have been generated by photo absorption in a material layer identical to the first barrier layer 34 or the second barrier layer 38, move until recombination is defined as D1, the particular thickness may be equal to D1.

A total thickness of the first and second barrier layers, t1+t2, may be a barrier layer thickness at which most of incident light is absorbed. The total thickness of the first and second barrier layers, t1+t2, may be, for example, less than or equal to about 100 nm. This condition may be applicable to some embodiments as described below, wherein more than two barrier layers are included. An optical device according to some embodiments may be configured to exhibit a high photo absorption rate as well as a high photo separation efficiency. The first and second barrier layers 34 and 38 may be referred to as photo-absorbing layers for convenience sake. The first barrier layer 34 may include a 2D material layer or a semiconductor layer. The second barrier layer 38 may include a 2D material layer or a semiconductor layer. The first and second barrier layers 34 and 38 may include identical material layers or different material layers. For example, the first and second barrier layers 34 and 38 may be identical 2D material layers or identical semiconductor layers. In addition, one of the first barrier layer 34 and the second barrier layer 38 may include a 2D material layer and the other may include a semiconductor layer. In addition, the first barrier layer 34 and the second barrier layer 38 may include 2D material layers different from each other. In addition, when the first barrier layer 34 and the second barrier layer 38 are semiconductor layers, the first and second barrier layers 34 and 38 may include semiconductor layers different from each other. The 2D material layer may include, for example, a graphene layer in a multi-layer. The thickness of the semiconductor layer may be, for example, either equal to or less than about 1 nm~about 1 mm, or about 1 nm~hundreds of µm. The semiconductor layer may include, for example, a semiconductor material layer having 2D material characteristics, hereinafter a 2D semiconductor layer. The 2D semiconductor layer may include a metal chalcogenide-based material layer. The metal chalcogenide-based material layer may include a transition metal dichalcogenide (TMD) layer including a transition metal and a chalcogen element. The transition metal may include one of Mo, W, Nb, V, Ta, Ti, Zr, Hf, Tc, and Re. The chalcogen element may include one of S, Se, and Te.

The TMD layer may be expressed as $MX_2$. "M" may include the transition metal and "X" may include the chalcogen element. Some of the TMD layer may be expressed as MX and, for example, the TMD layer may include a CuS layer. Since the TMD layer is a material layer including a combination of the transition metal and the chalcogen element, various TMD layers may be formed.

For example, the TMD layer may include a $MoS_2$ layer, a $MoSe_2$ layer, a $MoTe_2$ layer, a $WS_2$ layer, a $WSe_2$ layer, a $WTe_2$ layer, a $ZrS_2$ layer, a $ZrSe_2$ layer, a $HfS_2$ layer, a $HfSe_2$ layer, a $NbSe_2$ layer, a $ReSe_2$ layer, a CuS layer, etc.

The metal dichalcogenide-based material layer may also include a material layer including a non-transition metal and the chalcogen element. The non-transition metal may include, for example, Ga, In, Sn, Ge, Pb, etc. Various metal chalcogenide-based material layers may be formed by combining non-transition metals and chalcogen elements.

For example, the metal chalcogenide-based material layer including the non-transition metal as a component may include a $SnSe_2$ layer, a GaS layer, a GaSe layer, a GaTe layer, a GeSe layer, an $In_2Se_3$ layer, an $InSnS_2$ layer, etc.

Chalcogen elements, transition metals or non-transition metals, which may be included in the metal chalcogenide-based material layer, are not limited hereto.

The semiconductor layer may not be limited to the 2D material or a 2D semiconductor. In other words, the semiconductor layer may be not the 2D material but the semiconductor material layer. For example, the semiconductor layer may include quantum dots having semiconductor characteristics. For example, the semiconductor layer may include a quantum dot-contained layer and, as another example, the semiconductor layer may include a quantum dot layer. When the semiconductor layer is a quantum dot-contained layer, the semiconductor layer may have a shape where the quantum dot is included in a semiconductor material layer.

The quantum dot has high quantum yield and high stability. In addition, it is easy to control characteristics of the quantum dot by controlling a dot size.

The quantum dot layer may include a plurality of quantum dots. Each quantum dot may include a core unit and a shell unit. The shell unit may completely surround the core unit. The shell unit may have a single shell or a double shell structure. The diameter of each quantum dot may be, for example, less than or equal to about 10 nm. An organic ligand may exist on a surface of each of the quantum dots. The organic ligand may include, for example, oled acid, trioctylphosphne, trioctylamine, trioctylphosphine oxide, etc. When necessary, the organic ligand may be removed. Each of the quantum dots may include a colloidal quantum dot. The core unit may include at least one of CdSe, InP, PbS, PbSe and CdTe. In addition, the shell unit may include at least one of CdS and ZnS.

The semiconductor layer may also include at least one material of a semiconductor including IV group elements such as Si, Ge, and SiGe, a III-V group compound semiconductor, an oxide semiconductor, a nitride semiconductor, an oxynitride semiconductor, etc.

The first and second barrier layers 34 and 38 may be transparent to light in given wavelength ranges, respectively. For example, the second barrier layer 38 may absorb light in a blue color range, or blue light, and be transparent to light in other ranges. The first barrier layer 34 may absorb light in a red color range, or red light, and be transparent to light in other ranges. A barrier layer which may absorb light in a green color range, or green light, and be transparent to light in other ranges, in some embodiments described below, wherein more than two barrier layers are used, may be used together with other barrier layers.

Figure 3:
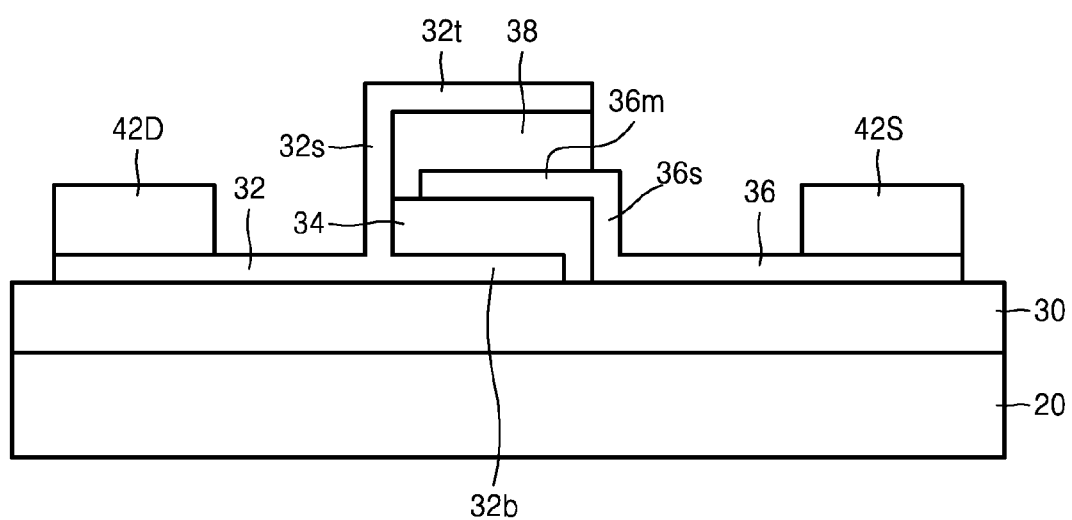
FIG. 3 is a cross-sectional view of the optical device, cut along line 3-3' in FIG. 1.

FIG. 3 is a cross-sectional view of the optical device, cut along line 3-3' in FIG. 1.

Referring to FIG. 3, the insulating layer 30 is on the substrate 20. The first channel layer 32 is formed on a partial region of the insulating layer 30. The second channel layer 36 is formed on another region of the insulating layer 30. The first channel layer 32 and the second channel layer 36 are spaced apart from each other on the insulating layer 30. The first channel layer 32 further includes a bottom channel layer 32b, a top channel layer 32t and a side channel layer 32s. The bottom channel layer 32b and the top channel layer 32t are spaced apart from each other, and connected through the side channel layer 32s. The top channel layer 32t is above the bottom channel layer 32b. The bottom channel layer 32b and the top channel layer 32t may be in parallel with each other. The side channel layer 32s may be perpendicular to the substrate 20. The bottom and top channel layers 32b and 32t may be perpendicular to the side channel layer 32s. The top channel layer 32t may be spaced apart from the insulating layer 30 and in parallel with the substrate 20. The second channel layer 36 may further include a side channel unit 36s which is upwardly extended, and a horizontal channel unit 36m which is horizontally extended from the side channel unit 36s. The side channel unit 36s is perpendicular to the substrate 20. The horizontal channel unit 36m is spaced apart from the insulating layer 30, and perpendicular to the substrate 20. The horizontal channel unit 36m is between the bottom channel layer 32b and the top channel layer 32t of the first channel layer 32. The horizontal channel unit 36m is spaced apart from the side channel layer 32s of the first channel layer 32. The horizontal channel unit 36m may be in parallel with the bottom and top channel layers 32b and 32t. The first barrier layer 34 is between the bottom channel layer 32b of the first channel layer 32 and the horizontal channel unit 36m of the second channel layer 36. The first barrier layer 34 is formed on the bottom channel layer 32b, and fills a space between the bottom channel layer 32b and the second channel layer 36. The first barrier layer 34 is in contact with the insulating layer 30 between the bottom channel layer 32b and the second channel layer 36. An upper side surface of the first barrier layer 34 is flat. The horizontal channel unit 36m of the second channel layer 36 covers the upper side surface of the first barrier layer 34. The side channel unit 36s of the second channel layer 36A covers a right side surface of the first barrier layer 34. The side channel layer 32s of the first channel layer 32 covers a left side surface of the first barrier layer 34. The second barrier layer 38 is between the horizontal channel unit 36m of the second channel layer 36 and the top channel layer 32t of the first channel layer 32. The second barrier layer 38 is formed on the horizontal channel unit 36m of the second channel layer 36 and fills a space between the horizontal channel unit 36m and the side channel layer 32s. The second barrier layer 38 is in contact with the first barrier layer 34 between the horizontal channel unit 36m and the side channel layer 32s. An upper side surface of the second barrier layer 38 is flat, and the top channel layer 32t of the first channel layer 32 covers the upper side surface of the second barrier layer 38. The side channel layer 32s of the first channel layer 32 covers a left side surface of the second barrier layer 38. The drain electrode 42D is on the first channel layer 32. The source electrode 42S is on the second channel layer 36. The drain electrode 42D is spaced apart from the side channel layer 32s. The source electrode 42S is spaced apart from the side channel unit 36s.

In some embodiments, when the optical device is configured to enable light to be directly incident on the top channel layer 32t in FIG. 3, a portion of the first channel layer 32, which is directly in contact with the insulating layer 30, may include a metal layer. In some embodiments, the bottom channel layer 32b may include the metal layer, and the drain electrode 42D may be formed on the metal layer.

FIGS. 4(a) and 4(b) are a cross-sectional views illustrating energy band structures of the first and second channel layers 32 and 36, and the first and second barrier layers 34 and 38 of the optical device illustrated in FIGS. 1 through 3 and an energy band structure of a conventional optical device for comparison with the energy band structures of the first and second channel layers 32 and 36, and the first and second barrier layers 34 and 38.

FIG. 4(a) illustrates the energy band structure of a conventional optical device such as a photodetector and FIG. 4(b) illustrates the energy band structure of the optical device illustrated in FIGS. 1 through 3. The energy band structure in FIG. 4 is the energy band structure when no voltage is applied to optical devices. The energy band structure of the conventional optical device illustrated in FIG. 4(a) corresponds to some embodiments where one barrier layer is located between two graphene layers. In FIG. 4(a), E1 through E5 represent energy bands corresponding to a top graphene layer, the barrier layer, a bottom graphene layer, the insulating layer, and the substrate or a back gate, respectively. In FIG. 4(b), 20E and 30E represent energy bands of the substrate or the back gate 20 and the insulating layer 30, respectively; 32tE and 32bE represent those of the top and bottom channel layers 32t, 32b of the first channel layer 32, respectively; and 36mE represents that of the horizontal channel unit 36m of the second channel layer 36. In addition, reference numerals 34E and 38E represent energy bands of the first barrier layer 34 and the second barrier layer 38, respectively.

The principle of the optical device in the present inventive concepts, or photo absorption, and corresponding generation and movement of carriers, is described with reference to FIG. 4.

When the thickness T3 of the barrier layer having the energy band structure illustrated in FIG. 4(a) is equal to a sum t1+t2 of the first thickness t1 of the first barrier layer 34 and the second thickness t2 of the second barrier layer 38 having the energy band structure illustrated in FIG. 4(b), that is, when the thickness T3 of the barrier layer illustrated in (a) is approximately 20 nm and the thicknesses t1 and t2 of the first and second barrier layers 34 and 38 illustrated in (b) are approximately 10 nm, respectively, the optical device comprising the energy band structure of (a) and the optical device comprising the energy band structure of (b) may be associated with identical photo absorption rates, since the thicknesses of barrier layers in (a) and (b) are identical, and the amount of photo absorption by the horizontal channel unit 36m of FIG. 3, which is between two barrier layers 34 and 38 in the optical device having the energy band structure of (b), is very small relative to a thickness of barrier layers 38 and 34, for example approximately 2.3% relative to a thickness of barrier layers 38 and 34.

In some embodiments, an optical device comprising an energy band structure as shown in (b) may be associated with a different photo separation efficiency, relative to an optical device comprising an energy band structure as shown in (a).

When identical light is incident on optical devices comprising the energy band structures of (a) and (b), respectively, electrons $e^-$ and holes $h^+$ are generated due to photoelectrical effect, in the barrier layer having a second energy band E2 of the optical device having the energy band structure of (a), and in the first and second barrier layers 34 and 38 having energy bands 34E and 38E, respectively, of the optical device having the energy band structure of (b). In the case of (a), the maximum thickness of the barrier layer which enables electrons and holes generated in the barrier layer to penetrate the barrier layer in order to move out to adjacent channel layers or graphene layers may be approximately 20 nm.

In some embodiments, in the case of (b), the maximum thickness of each of the barrier layers which enables electrons and holes generated in the respective first and second barrier layers 34 and 38 to penetrate the barrier layers in order to move out to adjacent channel layers or graphene layers may be approximately 10 nm.

In some embodiments, the maximum thickness of the barrier layer through which generated electrons and holes may perform tunneling in the embodiment shown in (a) may be approximately twice the maximum thickness through which generated electrons and holes may perform tunneling in the embodiment shown in (b). Thus, electrons and holes may recombine during the penetration process through the barrier layer shown in (a), or their movement may be limited due to defects in the barrier layer shown in (a). As a result, the photo separation efficiency associated with the embodiment shown in (a) may be less than the photo separation efficiency associated with the embodiment shown in (b).

In some embodiments, the thickness of the barrier layer shown in (b) is approximately 10 nm, and electrons and holes may penetrate the barrier layer before they recombine or encounter any defects. As a result, the photo separation efficiency of the optical device comprising the energy band structure shown in (b) may be higher than that of the optical device comprising the energy band structure shown in (a). When the graphene channel layer is doped in the optical device having the energy band structure of (b), slopes of the energy bands 34E, 38E of the first and second barrier layers 34, 38 may be further increased, which may result in an increase in the built-in potential and thus, a further increase in the photo separation efficiency associated with the embodiment shown in (b), relative to the photo separation efficiency associated with the embodiment shown in (a).

Figure 5:
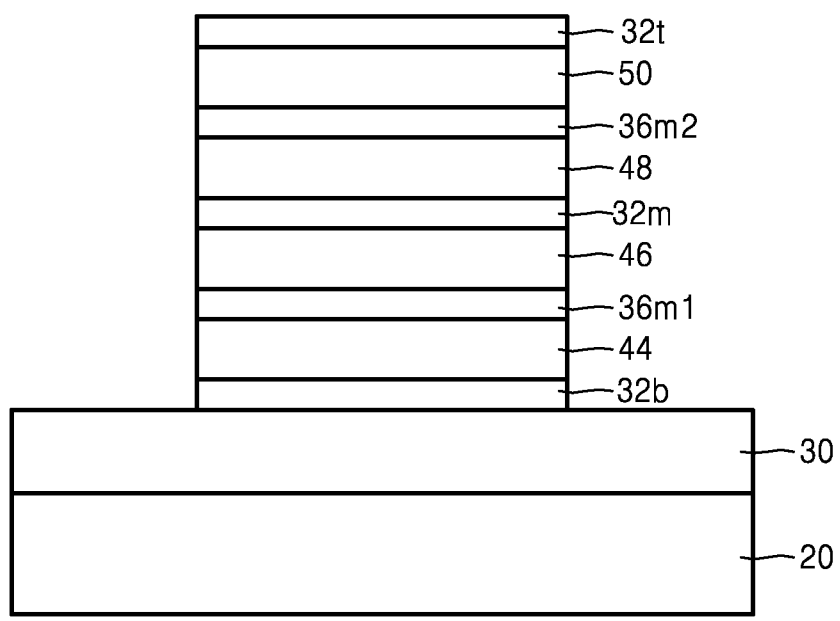
FIGS. 5 and 6 are cross-sectional views of an optical device including the 2D material, according to some embodiments.
Figure 6:
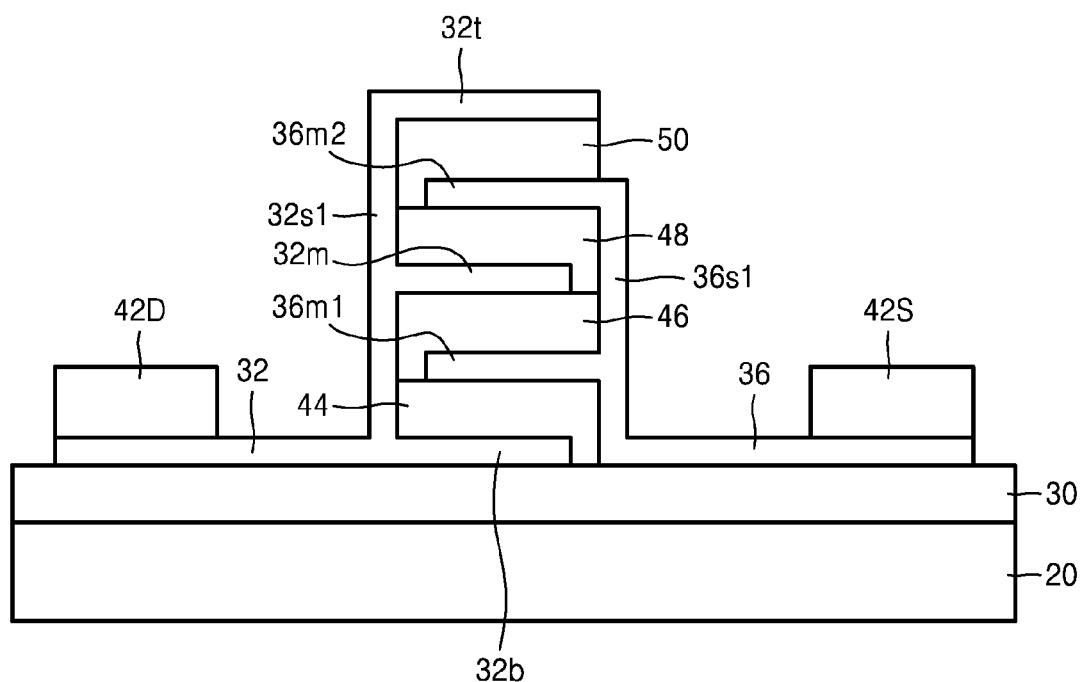

FIG. 5 and FIG. 6 illustrate an optical device according to some embodiments. A plan view of the optical device illustrated in FIG. 5 and FIG. 6 may be identical to the plan view shown in FIG. 1. Thus, FIG. 5 may be identical to an illustration of another example of a cross-section of the optical device, cut along line 2-2' in FIG. 1. FIG. 6 may be identical to illustrating another example of a cross-section of the optical device, cut along line 3-3' in FIG. 1.

Portions different from FIG. 2 only are described. Like reference numerals described in explanation for FIG. 2 denote like elements.

Referring to FIG. 5, the bottom channel layer 32b is formed on the insulating layer 30. A third barrier layer 44, a first horizontal channel unit 36m1, a fourth barrier layer 46, an intermediate channel layer 32m, a fifth barrier layer 48, a second horizontal channel unit 36m2, a sixth barrier layer 50 and the top channel layer 32t may be sequentially laminated over the bottom channel layer 32b. Material comprising the intermediate channel layer 32m may be identical to that of the top and bottom channel layers 32t and 32b. The first and second horizontal channel units 36m1 and 36m2 may be identical to the horizontal channel unit 36m described in FIG. 2 and FIG. 3. Optical and structural characteristics related with photo absorption and photo separation of the third through the sixth barrier layers 44, 46, 48 and 50 may be identical or similar to those of the first and second barrier layers 34 and 38 described in FIG. 2. The third barrier layer 44 may absorb light in a first wavelength range and be transparent to light in other wavelength ranges. The fourth barrier layer 46 may absorb light in a second wavelength range and be transparent to light in other wavelength ranges. The fifth barrier layer 48 may absorb light in a third wavelength range and be transparent to light in other wavelength ranges. The sixth barrier layer 50 may absorb light in a fourth wavelength range and be transparent to light in other wavelength ranges. The first wavelength range may include an infra-red light range. The second wavelength range may include a red color light range. The third wavelength range may include a green color light range. The fourth wavelength range may include a blue color light range. Since light absorption ranges of the first through fourth barrier layers 44, 46, 48 and 50 are different, the first through fourth barrier layers 44, 46, 48 and 50 may include different material layers relative to each another and may include different work functions or band gaps relative to each other. In addition, when the first through fourth barrier layers 44, 46, 48 and 50 are doped material layers, doped states of each of the first through fourth barrier layers 44, 46, 48 and 50 may be different from one another. The tandem structure of the first through fourth barrier layers 44, 46, 48 and 50, as illustrated, may allow absorbing all light per wavelength range of incident light.

Referring to FIG. 6, the third barrier 44 is between the bottom channel layer 32b of the first channel layer 32 and the first horizontal channel unit 36m1 of the second channel layer 36. The third barrier layer 44 is formed on the bottom channel layer 32b. The third barrier layer 44 fills a space between the bottom channel layer 32b and the side channel unit 36s1 of the second channel layer 36. The third barrier layer 44 is in contact with a portion of the insulating layer 30 between the bottom channel layer 32b and the side channel layer 36s1. The side channel unit 36s1 of the second channel layer 36 covers a right side surface of the third barrier layer 44, and the side channel layer 32s1 of the first channel layer 32 covers a left side surface of the third barrier layer 44. An upper side surface of the third barrier layer 44 may be flat. The first horizontal channel unit 36m1 of the second channel layer 36 covers most of the upper side surface of the third barrier layer 44. The first horizontal channel unit 36m1 is spaced apart from the side channel layer 32s1. The fourth barrier layer 46 is between the intermediate channel layer 32m of the first channel layer 32 and the first horizontal channel unit 36m1 of the second channel layer 36. The fourth barrier layer 46 is formed on the first horizontal channel unit 36m1 and is in contact with the third barrier layer 44 while filling a space between the first horizontal channel unit 36m1 and the side channel layer 32s1. The intermediate channel layer 32m of the first channel layer 32 covers an upper side surface of the fourth barrier layer 46. The fifth barrier layer 48 exists between the intermediate channel layer 32m and the second horizontal channel unit 36m2. The fifth barrier layer 48 is formed on the intermediate channel layer 32m and is in contact with the fourth barrier layer 46 while filling a space between the intermediate channel layer 32m and the side channel unit 36s1. The second horizontal channel unit 36m2 of the second channel layer 36 covers most of an upper side surface of the fifth barrier layer 48. The sixth barrier layer 50 exists between the top channel layer 32t of the first channel layer 32 and the second horizontal channel unit 36m2 of the second channel layer 36. The sixth barrier layer 50 is formed on the second horizontal channel unit 36m2 and is in contact with the fifth barrier layer 48 while filling a space between the second horizontal channel unit 36m2 and the side channel layer 32s1. The top channel layer 32t of the first channel layer 32 covers an upper side surface of the sixth barrier layer 50. The side channel layer 32s1 of the first channel layer 32 covers left side surfaces of the fourth through sixth barrier layers 46, 48 and 50. The side channel unit 36s1 covers right side surfaces of the fourth and the fifth barrier layers 46 and 48.

As illustrated in FIG. 6, the third through sixth barrier layers 44, 46, 48 and 50 of the optical device in the exemplary embodiments are laminated in a tandem structure, and channel layers 32b, 32m and 32t connected to the drain electrode 42D and horizontal channel units 36m1 and 36m2 connected to the source electrode 42S are alternately laminated between pairs of barrier layers. Accordingly, a sufficient amount of incident light may be absorbed, and most of electrons and holes generated during this process may move out to adjacent channels. Thus, the optical device in the exemplary embodiments may increase both photo absorption rate and photo separation efficiency.

Figure 7:
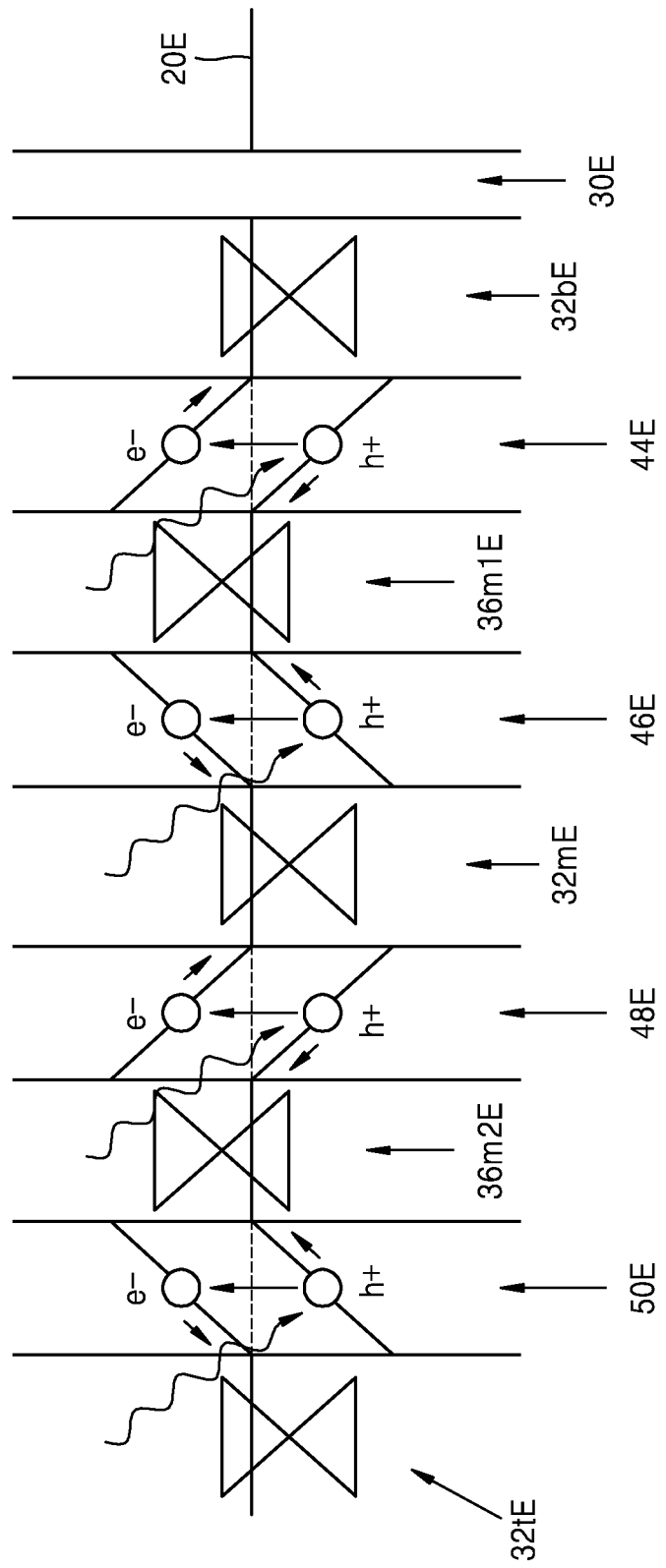
FIG. 7 is a cross-sectional view illustrating the energy band structure of the optical device in FIGS. 5 and 6 at an equilibrium state.

FIG. 7 illustrates an energy band structure of the optical device illustrated in FIGS. 5 and 6 at an equilibrium state.

In FIG. 7, reference numerals 32tE and 32bE represent energy bands of the top and bottom channel layers 32t and 32b of the first channel layer 32, and 32mE represents an energy band of the intermediate channel layer 32m of the first channel layer 32. Reference numerals 36m1E and 36m2E represent energy bands of the first and second horizontal channel units 36m1, 36m2 of the second channel layer 36. 44E, 46E, 48E and 50E represent energy bands of the third through sixth barrier layers 44, 46, 48 and 50, respectively. In addition, reference numerals 20E and 30E represent energy bands of the substrate 20 and the insulating layer 30, respectively.

Referring to FIG. 7, electrons e⁻ and holes h⁺ generated inside each of the first through fourth barrier layers 44, 46, 48 and 50 in accordance with light absorption move out to adjacent electrodes or channel layers due to the built-in potential of each of the first through fourth barrier layers 44, 46, 48 and 50. In this case, the thickness conditions of each of the first through fourth barrier layers 44, 46, 48 and 50 may be identical to those of one or more of the first and second barrier layers 34 and 38 illustrated in FIG. 2. Thus, electrons e⁻ and holes h⁺ generated inside each of the first through fourth barrier layers 44, 46, 48 and 50 may move out to adjacent channel layers. In FIG. 6, when channel layers 32b, 36m1, 32m, 36m2 and 32t comprise doped channel layers, slopes of an energy band corresponding to each of the first through fourth barrier layers 44, 46, 48 and 50 may increase relative to non-doped channel layers, which indicates an increase in the built-in potential of each of the first through fourth barrier layers 44, 46, 48 and 50. Since the photo separation efficiency associated with an optical device may increase as the built-in potential of each of the first through fourth barrier layers 44, 46, 48 and 50 increases, the photo separation efficiency of the optical device in FIG. 6 may further increase when channel layers 32b, 36m1, 32m, 36m2 and 32t are doped channel layers.

In some embodiments, when the optical device illustrated in FIG. 5 does not sufficiently absorb incident light via the third through the sixth barrier layers 44, 46, 48 and 50, additional barrier layers may be added to form a structure to absorb all of the incident light.

Figure 8:
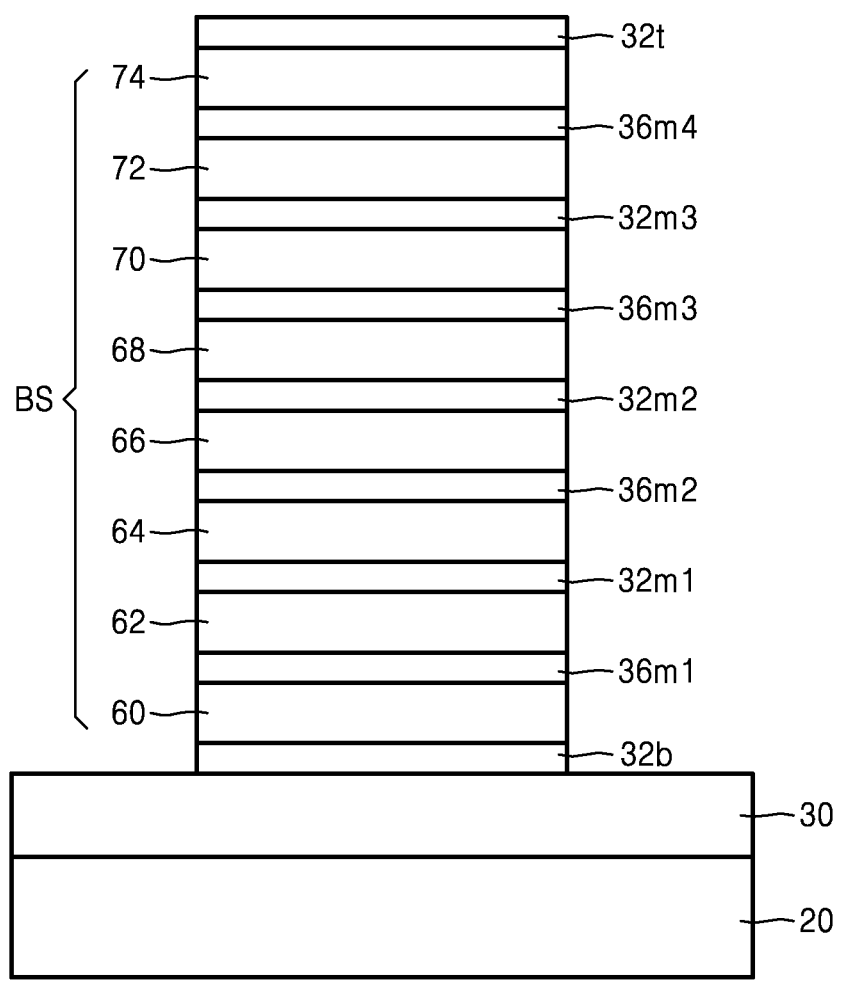
FIG. 8 is a cross-sectional view of an optical device including the 2D material, according to some embodiments.

FIG. 8 is a cross-sectional view of an optical device including the 2D material, according to some embodiments.

Referring to FIG. 8, the bottom channel layer 32b is on the insulating layer 30. A plurality of barrier layers 60, 62, 64, 66, 68, 70, 72 and 74 forming a tandem structure over the bottom channel layer 32b is sequentially laminated. Channel layers different from one another are alternately laminated between a plurality of barrier layers 60, 62, 64, 66, 68, 70, 72 and 74.

The first horizontal channel unit 36m1 exists between a seventh barrier layer 60 and an eighth barrier layer 62. The first horizontal channel unit 36m1 is connected to a first electrode. The first intermediate channel layer 32m1 exists between the eighth barrier layer 62 and a ninth barrier layer 64. The first intermediate channel layer 32m1 is connected to a second electrode. A second horizontal channel unit 36m2 connected to the first electrode exists between the ninth barrier layer 64 and a tenth barrier layer 66. A second intermediate channel layer 32m2 connected to the second electrode exists between the tenth barrier layer 66 and an eleventh barrier layer 68. A third horizontal channel unit 36m3 connected to the first electrode exists between the eleventh barrier layer 68 and a twelfth barrier layer 70. A third intermediate channel layer 32m3 connected to the second electrode exists between the twelfth barrier layer 70 and a thirteenth barrier layer 72. A fourth horizontal channel unit 36m4 connected to the first electrode exists between the thirteenth barrier layer 72 and a fourteenth barrier layer 74. The top channel layer 32t connected to the second electrode exists on the fourteenth barrier layer 74. The first electrode may include the source electrode. The second electrode may include the drain electrode. Accordingly, all of the first through fourth horizontal channel units 36m1, 36m2, 36m3 and 36m4 are connected to the source electrode and all of the bottom and top channel layers 32b and 32t and the first through third intermediate channel layers 32m1, 32m2 and 32m3 are connected to the drain electrode. The seventh through the fourteenth barrier layers 60, 62, 64, 66, 68, 70, 72 and 74 may comprise a layer structure which absorbs light in all wavelength ranges included in incident light. For example, when light is downwardly incident on the substrate 20, in the barrier stack BS, upper layers may absorb light in a short wavelength range, intermediate layers may absorb light in an intermediate wavelength range, and lower layers may absorb light in a long wavelength range. Or, light in a long wavelength range may be absorbed in upper layers of the barrier stack BS and light in a short wavelength range may be absorbed in lower layers.

As an example, the seventh and the eighth barrier layers 60 and 62 may include layers which are configured to absorb light in an infrared range. The ninth and the tenth barrier layers 64, 66 may include layers which are configured to absorb light in a red color range. The eleventh and the twelfth barrier layers 68 and 70 may include layers which are configured to absorb light in a green color range. The thirteenth and the fourteenth barrier layers 72 and 74 may include layers which are configured to absorb light in a blue color range. When incident light includes relatively large amount of light in a specific wavelength range, for example, when incident light includes relatively large amount of light in a blue color range, the barrier stack BS may include a layer structure which is configured to absorb relatively large amount of light in a blue color range. As another example, three barrier layers 70, 72 and 74 in the barrier stack BS may be configured to absorb light in a blue color range, and other barrier layers 60, 62, 64, 66 and 68 may be configured to absorb light in other color ranges, or light in red color, green color and infrared ranges, except light in a blue color range.

Figure 9:
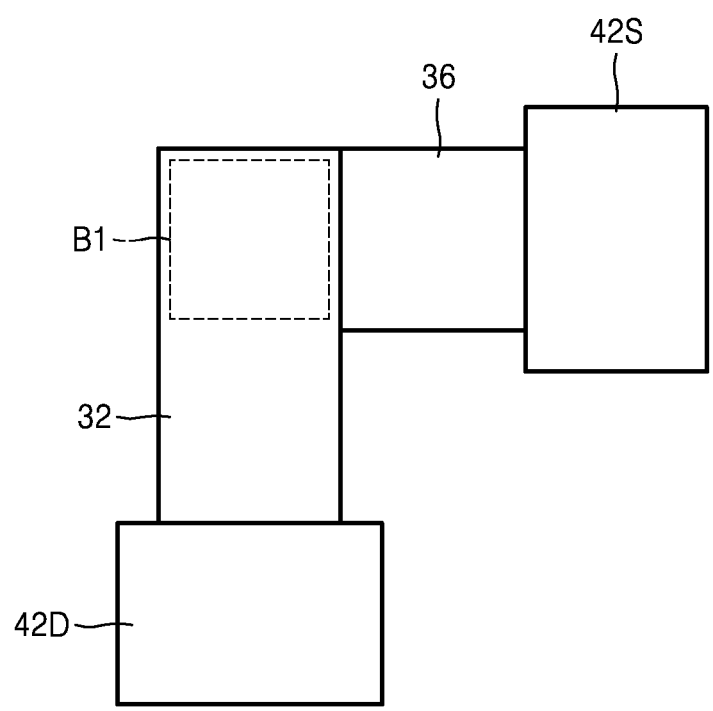
FIG. 9 is a cross-sectional view of an optical device including the 2D material, according to some embodiments.
Figure 10:
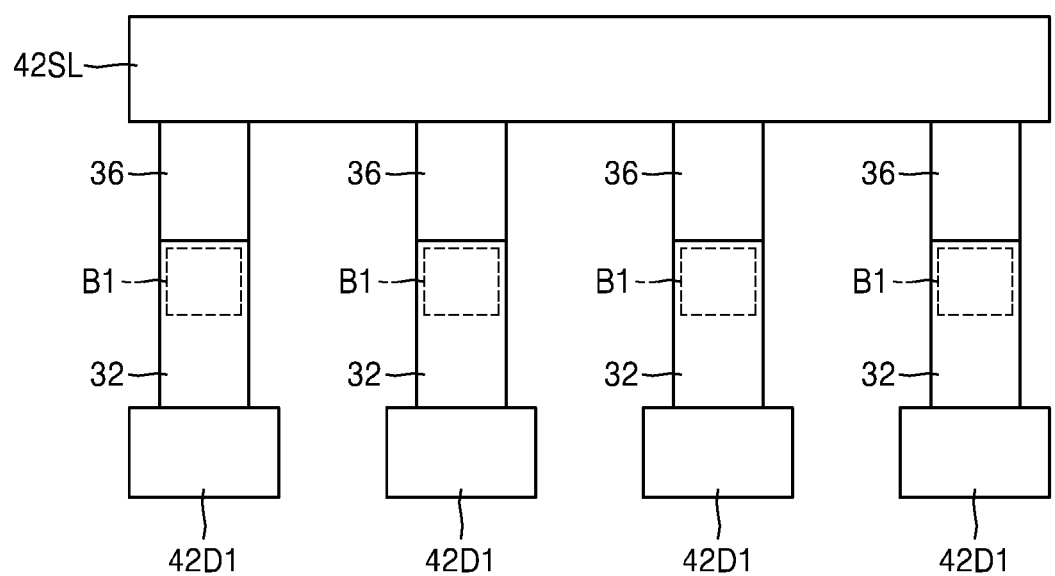
FIG. 10 is a cross-sectional view of an optical device including the 2D material, according to some embodiments.

FIG. 9 and FIG. 10 illustrate optical devices according to some embodiments, which show layout shapes different from the example described above.

Referring to FIG. 9, the source electrode 42S and the drain electrode 42D arranged such that the electrodes 42S and 42D extend in a non-parallel configuration. The second channel layer 36 connected to the source electrode 42S and the first channel layer 32 connected to the drain electrode 42D extend perpendicular to each other. A portion of the first channel layer 32 and a portion of the second channel layer 36 overlap each other. One or more barrier layers may be located in a region where the first and second channel layers 32 and 36 overlap each other. The reference numeral B1 indicates a region where one or more barrier layers may be located.

In FIG. 9, the first and second channel layers 32 and 36 are placed perpendicular to each other. However, in some embodiments the first channel layer 32 and the second channel layer 36 may not be perpendicular to each other, extend at right angles relative to each other, etc. For example, an angle between the first channel layer 32 and the second channel layer 36 may be acute or obtuse.

FIG. 10 illustrates a plurality of optical devices sharing a common source electrode line 42SL according to some embodiments.

Referring to FIG. 10, first through fourth drain electrodes 42D1, 42D2, 42D3 and 42D4 are placed proximate to a common individual source electrode line 42SL. A quantity of drain electrodes placed proximate to one source electrode line 42SL may be either more than or equal to, or less than or equal to 4. In some embodiments, each pair of the first channel layer 32 and the second channel layer 36 are placed between the source electrode line 42SL and the first through fourth drain electrodes 42D1, 42D2, 42D3 and 42D4. Four pieces of second channel layers 36 are connected to the source electrode line 42SL. Four pieces of second channel layers 36 are spaced apart from one another. The first channel layer 32 is connected to the first through fourth drain electrodes 42D1, 42D2, 42D3 and 42D4, respectively. A portion of the first channel layer 32 and a portion of the second channel layer 36 are overlapped. The reference numeral B1 indicates regions where barrier layers are placed, wherein the first and second channel layers 32 and 36 are overlapped.

A method of manufacturing an optical device including the 2D material according to some embodiments is described with reference to FIGS. 11 through 14. Like reference numerals are used for like elements which are identical to elements described in the optical device according to some embodiments of the present inventive concepts, and a description on like elements is omitted. In FIGS. 11 through 14, (a) illustrates a cross-section of the optical device, cut along line 2-2' in FIG. 1 and (b) illustrates a cross-section of the optical device, cut along line 3-3' in FIG. 1.

Figure 11A:
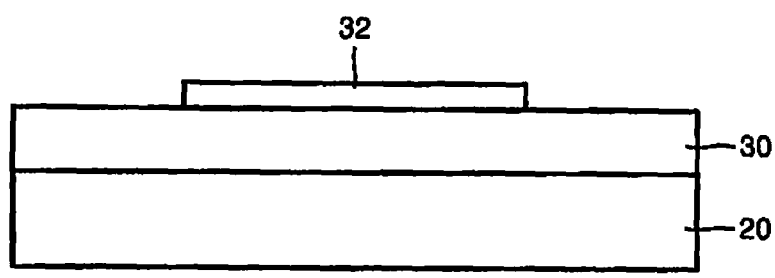
FIGS. 11(a), 11(b), 12(a), 12(b), 13(a), 13(b), 14(a), and 14(b) are cross-sectional views illustrating a method of manufacturing stage by stage the optical device including the 2D material according to some embodiments.
Figure 11B:
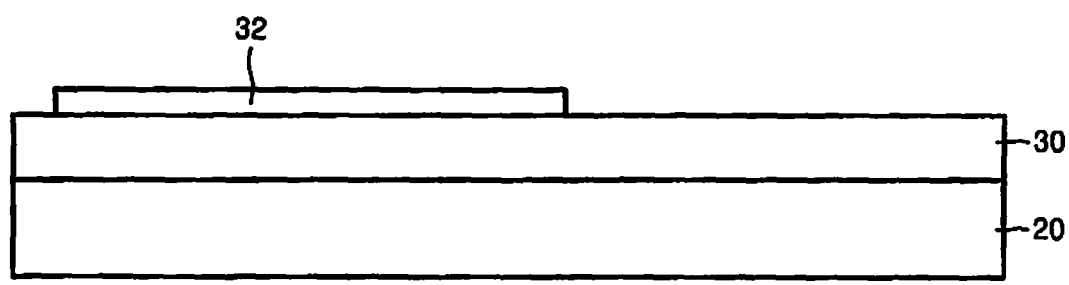

Referring to FIG. 11(a) and FIG. 11(b), the insulating layer 30 is formed on at least a portion of the substrate 20. The insulating layer 30 may comprise, for example, a $SiO_2$ layer. The first channel layer 32 may be formed on a partial region of the insulating layer 30. The first channel layer 32 may include either a 2D material layer or a semiconductor layer in a single layer. In some embodiments, when the first channel layer 32 is a 2D material layer, for example, a graphene layer, the first channel layer 32 may be directly grown on the insulating layer 30. In some embodiments, a graphene layer formed separately may be transferred onto the insulating layer 30.

Figure 12A:
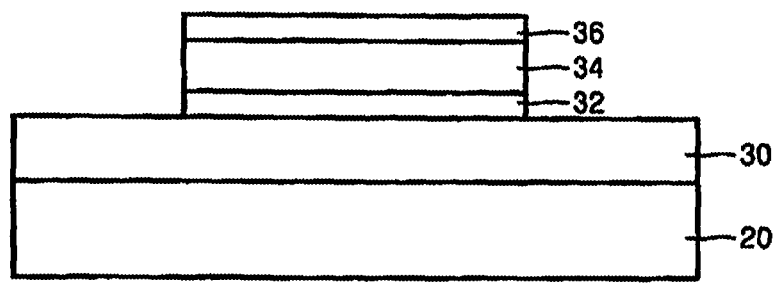
Figure 12B:
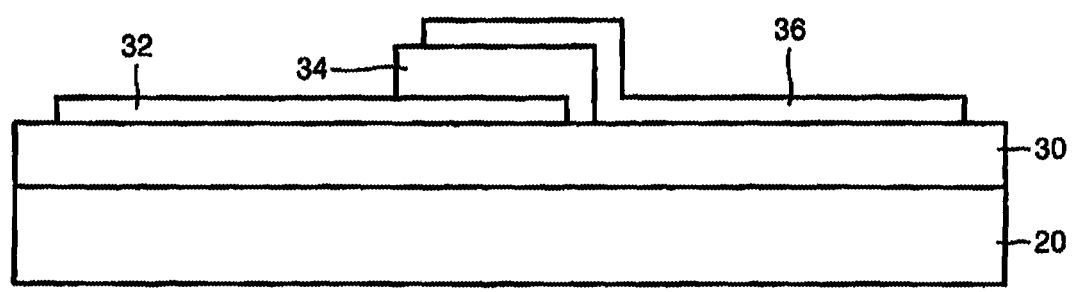

Referring to FIG. 12(a) and FIG. 12(b), the first barrier layer 34 is formed on at least a portion of the first channel layer 32. The first barrier layer 34 may be formed to cover at least one end of the first channel layer 32 and be in contact with the insulating layer 30. The first barrier layer 34 in this configuration may be formed based on applying one or more conventional photographing and etching processes. The second channel layer 36 is formed on at least a portion of the insulating layer 30. The second channel layer 36 is formed so that the second channel layer 36 is spaced apart from the first channel layer 32. The second channel layer 36 may be formed by an identical method applied to the first channel layer 32. The second channel layer 36 is formed to cover the side surface and up to a portion of the upper side surface of the first barrier layer 34. A portion of the upper side surface of the first barrier layer 34 may be exposed even after the second channel layer 36 is formed, as shown in FIG. 12(b).

Figure 13A:
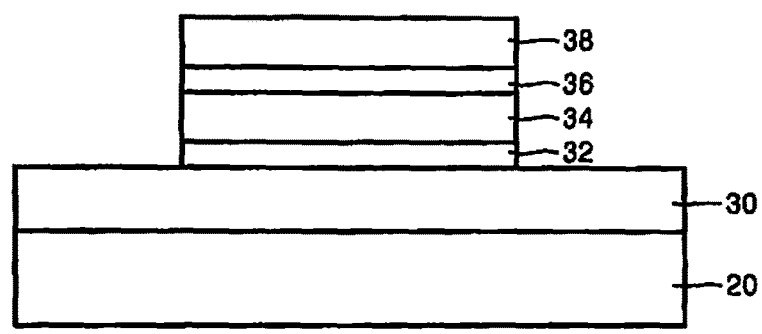
Figure 13B:
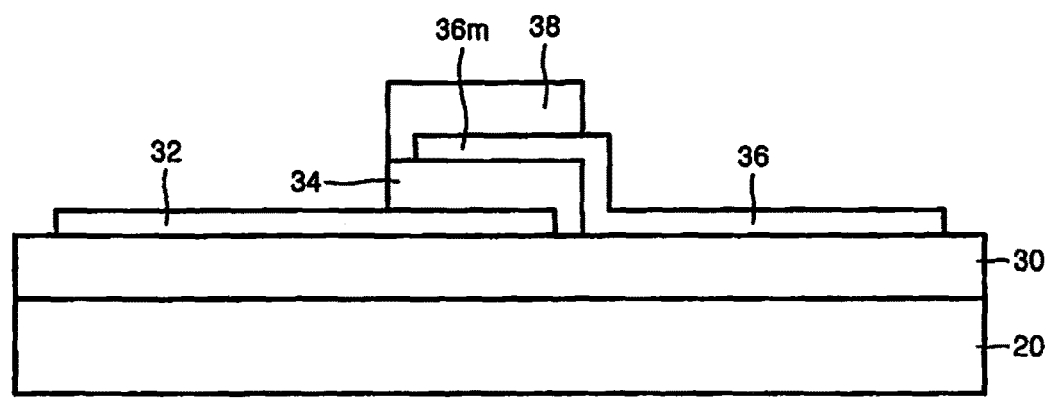

Referring to FIG. 13(a) and FIG. 13(b), the second barrier layer 38 is formed on at least a portion of the horizontal channel unit 36m of the second channel layer 36. The second barrier layer 38 may include a material comprising photo absorption characteristics and range similar to those of the first barrier layer 34, may include a different material from those of the first barrier layer 34, some combination thereof, etc. When the second barrier layer 38 is a doped layer, the second barrier layer 38 may be differently doped relative to the first barrier layer 34. For example, one of the first and second barriers 34 and 38 may be doped with a p-type dopant and the other of the first and second barriers 34 and 38 may be doped with an n-type dopant. A portion of the second barrier layer 38 may be in contact with the first barrier layer 34. A portion of the upper side surface of the horizontal channel unit 36m of the second channel layer 36 may be exposed after the second barrier layer 38 is formed, as shown in FIG. 13(b). In some embodiments, when another barrier layer is not further formed on the second barrier layer 38, the second barrier layer 38 may be formed to cover a complete portion of the upper side surface of the horizontal channel unit 36m.

Figure 14A:
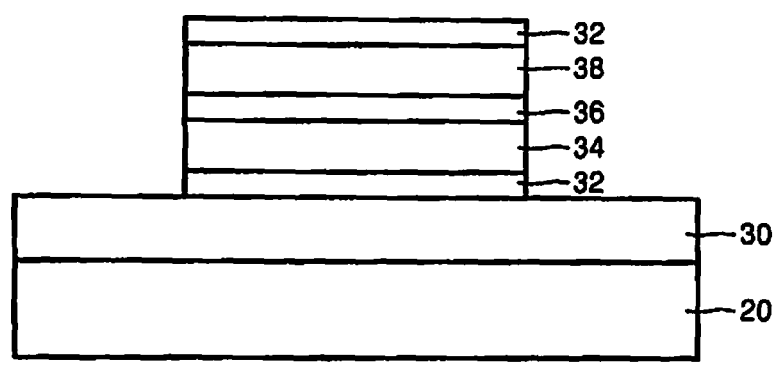
Figure 14B:
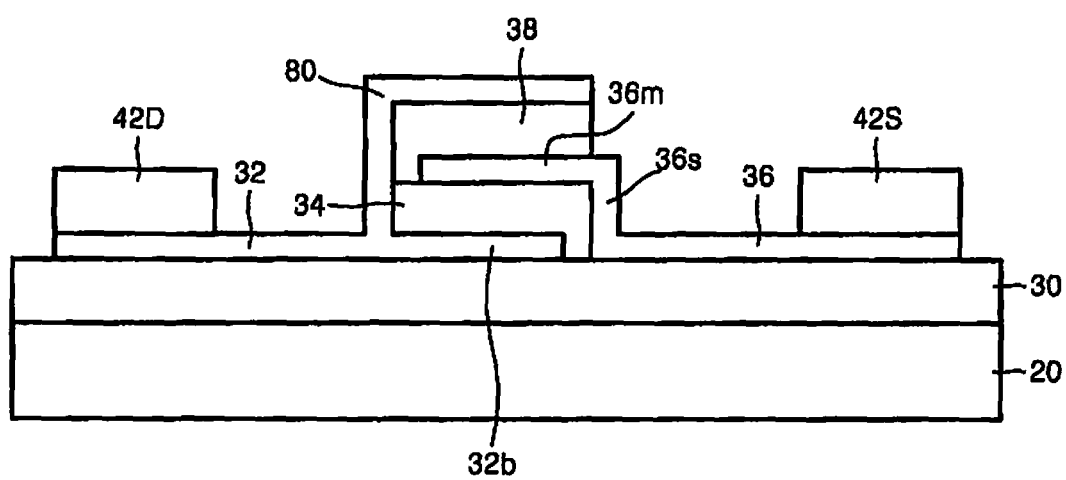

Referring to FIG. 14(a) and FIG. 14(b), a third channel layer 80 is formed to cover the upper side surface of the second barrier layer 38. The third channel layer 80 is formed to be in contact with the first channel layer 32. The third channel layer 80 may also be formed of a 2D material layer or a semiconductor layer in a single layer. The third channel layer 80 is formed to cover left side surfaces of the first and second barrier layers 34 and 38. A portion of the third channel layer 80 covering the upper side surface of the second barrier layer 38 may correspond to the top channel layer 32t of FIG. 3. A portion of the third channel layer 80 covering side surfaces of the first and second barrier layers 34 and 38 may correspond to the side channel layer 32s of FIG. 3. After the third channel layer 80 is formed, the drain electrode 42D may be formed on the first channel layer 32 and the source electrode 42S may be formed on the second channel layer 36. The source and the drain electrodes 42S and 42D may be also formed before the third channel layer 80 is formed.

In the optical devices illustrated in FIGS. 6 and 8, more than two barrier layers are repeatedly laminated over the insulating layer 30, and channel layers different from one another are alternately laminated between barrier layers. Thus, the optical devices illustrated in FIGS. 5-6, 8, and 9-10 may be also formed, without difficulty, based on the method presented in FIGS. 11 through 14.

An overall thickness of barrier layers, photo absorption layers, including the 2D material of the optical devices according to the exemplary embodiments may have a sufficient thickness to configure the barrier layers to absorb all of incident light. Here, the "sufficient thickness" may include a minimum thickness to absorb all of incident light, or either thicker or thinner than the minimum thickness. Accordingly, a photo absorption rate of the optical devices according to the exemplary embodiments may be equal to or more than that of conventional optical devices. In addition, a photo absorption layer including the 2D material in the optical devices according to the exemplary embodiments may be divided into a plurality of layers, while a thickness of each divided layer is thin and may be controlled to be the thickness to maximize the photo separation efficiency during a manufacturing process. Thus, when light is incident on the photo absorption layer, electrons and holes accordingly generated may move from the photo absorption layer out to electrodes or channel layers adjacent to the photo absorption layer. By using the optical devices according to the exemplary embodiments both photo absorption rate and photo separation efficiency may be increased.

In addition, since the photo absorption layer of the optical devices according to the exemplary embodiments may be a layer including the 2D material, and electrodes existing between a plurality of layers included in the photo absorption layer are the 2D material, such as graphene, electrodes, the optical devices presented in the exemplary embodiments may be realized in a thin membrane shape with a large area and applied to flexible devices.

In addition, the optical devices according to some embodiments may be applied to an optical apparatus or a photo electronic apparatus, using photo absorption, and electrons and holes accordingly generated, such as a CMOS charge image sensor, a photodetector of a health monitoring device, a solar cell, etc.

The foregoing description has been provided for purposes of illustration and description. It is not intended to be exhaustive or to limit the disclosure. Individual elements or features of a particular example embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

While some embodiments have been described with reference to the figures, it will be understood by those of ordinary skill in the art that various changes in form and details may be made therein without departing from the spirit and scope of the optical devices according to the exemplary embodiments as defined by the following claims. Thus, the true technological protection range of the present inventive concepts should be defined by the patent claims below.

What is claimed is:

1. An optical device comprising:
   a barrier stack on a substrate, the barrier stack including at least two barrier layers;
   a first channel layer on the substrate, the first channel layer including,
      a bottom channel layer extending, from a first side of the barrier stack, at least partially between the barrier stack and the substrate,
      a top channel layer extending, from the first side of the barrier stack, at least partially on a top surface of the barrier stack, and
      a side channel layer extending along side surfaces of the at least two barrier layers on the first side of the barrier stack, the side channel layer connecting the top channel layer and the bottom channel layer;
   a second channel layer on the substrate, the second channel layer including,
      a horizontal channel unit extending, from a second side of the barrier stack, at least partially between the at least two barrier layers, and
      a side channel unit extending along a side surface of at least a lower barrier layer of the at least two barrier layers on the second side of the barrier stack, the side channel unit connected to the horizontal channel unit;
   a drain electrode connected to the first channel layer, such that the drain electrode is connected to the bottom channel layer and the top channel layer via the side channel layer; and
   a source electrode connected to the second channel layer, such that the source electrode is connected to the horizontal channel unit via the side channel unit.

2. The optical device of claim 1, wherein the barrier stack further includes one or more barrier layers at least partially interposed by separate channel layers connected to either the drain electrode or to the source electrode in an alternating interposing sequence.

3. The optical device of claim 1, wherein at least one barrier layer of the at least two barrier layers includes at least one of a two-dimensional (2D) material layer or a semiconductor layer.

4. The optical device of claim 1, wherein the bottom channel layer includes a metal layer.

5. The optical device of claim 1, wherein the bottom channel layer and the top channel layer are doped in a first doping type, and the horizontal channel unit is doped in a second doping type which is opposite to the first doping type.

6. The optical device of claim 1, wherein a thickness of each barrier layer of the at least two barrier layers is less than a particular distance travelled by electrons and holes prior to recombination, the electrons and holes generated by photo absorption.

7. The optical device of claim 1, wherein the bottom channel layer and the top channel layer and the horizontal channel unit comprise 2D material layers in a single layer.

8. The optical device of claim 1, wherein the bottom channel layer and the top channel layer extend, relative to the horizontal channel unit, at a right angle, an acute, or an obtuse angle.

9. The optical device of claim 1, wherein the source electrode extends in a linear shape and the optical device further comprises a plurality of drain electrodes corresponding to the source electrode.

10. The optical device of claim 1, wherein at least one barrier layer of the at least two barrier layers includes a semiconductor layer, and the semiconductor layer includes at least one of a IV group semiconductor, a III-V group compound semiconductor, an oxide semiconductor, a nitride semiconductor, or an oxynitride semiconductor.

11. The optical device of claim 10, wherein the semiconductor layer includes at least one of a 2D semiconductor layer, a quantum dot-contained layer or a quantum dot layer.

12. The optical device of claim 10, wherein the semiconductor layer includes a 2D semiconductor layer, the 2D semiconductor layer including a metal chalcogenide-based material layer.

13. The optical device of claim 10, wherein the semiconductor layer includes a quantum dot layer, the quantum dot layer includes a plurality of quantum dots, and each quantum dot includes a core unit and a shell unit surrounding the core unit.

14. A method of manufacturing an optical device, the method comprising:
   forming a bottom channel layer on a substrate;
   forming a first barrier layer on the bottom channel layer;
   forming a second channel layer on the substrate, the second channel layer comprising a horizontal channel unit extended on at least a portion of a top surface of the first barrier layer and a side channel unit extended on a side surface of the first barrier layer;

forming a second barrier layer on the first barrier layer, such that the horizontal channel unit at least partially interposes between the first barrier layer and the second barrier layer;

forming a top channel layer and a side channel layer on the second barrier layer, such that the top channel layer covers a top surface of the second barrier layer, the side channel layer covers second side surfaces of the second barrier layer and the first barrier layer, and the side channel layer connects the top channel layer to the bottom channel layer to form a first channel layer;

forming a drain electrode on the first channel layer; and forming a source electrode on the second channel layer.

15. The method of claim 14, further comprising:

prior to forming the top channel layer, laminating at least one barrier layer on the second barrier layer; and laminating, in an alternating sequence between barrier layers comprising the second barrier layer and the at least one barrier layer, channel units connected to the source electrode and channel layers connected to the drain electrode.

16. The method of claim 14, wherein the first channel layer and the second channel layer are formed at a right angle to each other, at an acute angle to each other, or at an obtuse angle to each other.

17. The method of claim 14, wherein the source electrode is formed to extend in a linear shape, and the method further comprises forming a plurality of drain electrodes which correspond to the source electrode.

18. The method of claim 14, wherein the first channel layer includes a metal layer.

19. The method of claim 14, wherein the first channel layer and the second channel layer include separate two-dimensional (2D) material layers in a single layer.

20. The method of claim 14, wherein the first barrier layer and the second barrier layer each include at least one of a 2D material layer and a semiconductor layer, and the first barrier layer and the second barrier layer each include different photo absorption characteristics.

21. The method of claim 14, wherein the top channel layer, the second channel layer, and the bottom channel layer each include at least one doped layer.

22. The method of claim 14, wherein a thickness of each barrier layer, of the first barrier layer and the second barrier layer is less than a particular distance travelled by electrons and holes prior to recombination, the electrons and holes generated by photo absorption.

* * * * *